United States Patent [19]
Uchida

[11] 3,899,755
[45] Aug. 12, 1975

[54] FREQUENCY MODULATOR INCLUDING A CLAPP-TYPE OSCILLATOR

[76] Inventor: Teiji Uchida, c/o Nippon Electric Co. Ltd., Minatoku, Tokyo, Japan

[22] Filed: Sept. 28, 1966

[21] Appl. No.: 582,710

[30] Foreign Application Priority Data

Nov. 10, 1965 Japan .............................. 40-69015

[52] U.S. Cl. .................. 332/30; 307/320; 325/148; 331/36; 331/177; 332/16; 334/15

[51] Int. Cl. .......................................... H03c 3/22

[58] Field of Search ................ 332/16, 18, 30, 302; 307/320; 325/147, 148; 331/36 C, 177 V; 334/15

[56] References Cited

UNITED STATES PATENTS

| | | | |
|---|---|---|---|
| 2,984,794 | 5/1961 | Carter et al. | 332/30 V X |
| 3,252,108 | 5/1966 | Gregory | 332/30 V X |
| 3,324,414 | 6/1967 | Numakura | 307/320 X |
| 3,332,035 | 7/1967 | Kovalevski | 331/36 C X |
| 3,370,254 | 2/1968 | Keller | 332/30 V X |

*Primary Examiner*—Alfred L. Brody

[57] ABSTRACT

A transistorized frequency modulator including a Clapp-type oscillator having a transistor and a frequency defining circuit connected across the emitter and collector of the transistor, the frequency defining circuit comprising an inductive element and a plurality of capacitive elements wherein one of the capacitive elements is replaced by a variable capacitance diode. The modulating signal is provided to the terminals of the variable capacitance diode and a portion of the modulating signal is supplied directly to the emitter of the transistor so that the collector current increases when the capacitance of the variable diode decreases in response to the variation of the voltage of the modulating signal.

1 Claim, 2 Drawing Figures

PATENTED AUG 12 1975 3,899,755

FREQUENCY MODULATOR INCLUDING A CLAPP-TYPE OSCILLATOR

This invention relates to a transistorized wideband frequency modulator, and in particular, to one including a variable-capacitance diode.

In conventional frequency modulators using vacuum-tubes or transistors, the output power are subjected to variation when large frequency shifts are initiated. Due to these variations, an AM-PM conversion phenomenon takes place in which amplitude variation is converted into phase distortion. This conversion takes place in the FM modulator itself as well as the succeeding intermediate frequency amplifier and amplitude limiter, with the result that the signal to intermodulation noise ratio is degraded.

The phenomenon is described in greater detail in "FM Radio Engineering (FM musen kogaku)" edited by Teizan Sugawara (Nikkan Kogyo Shimbun Sha, Tokyo, 1959), pp. 553–558, and in an article by P. T. Sproul and H. D. Griffiths in "Bell System Technical Journal" Vol. 40, November issue (1961), pp. 1542–1547. The discussion included here is considered sufficient for an understanding of the present invention.

An example would be in an FM modulator for a super-multiplex telephone system consisting of 1200 or 1800 channels, or for a color television relay system where the frequency of the modulating signal is so high that the intermodulation noise resulting from the said AM-PM conversion phenomenon increases to the point where the aforementioned disadvantageous signal to intermodulation noise ratio is encountered. Inasmuch as the current amplification factor B decreases as the oscillation frequency of a transistorized oscillator increases, the output power is also inclined to decrease.

Recently, a transistorized oscillator comprising a variable-capacitance diode has been used as a frequency modulator for wideband signals. This type of modulator, however, is not applicable to a super-multiplex telephone system consisting of more than 1200 channels, since it does not have flat output power characteristics versus oscillation frequency for the reason mentioned.

Accordingly, it is the object of this invention to provide a transistorized frequency modulator which has a vastly improved oscillation frequency versus output power characteristic and signal to intermodulation noise ratio when subjected to wideband applications.

Figure 1:
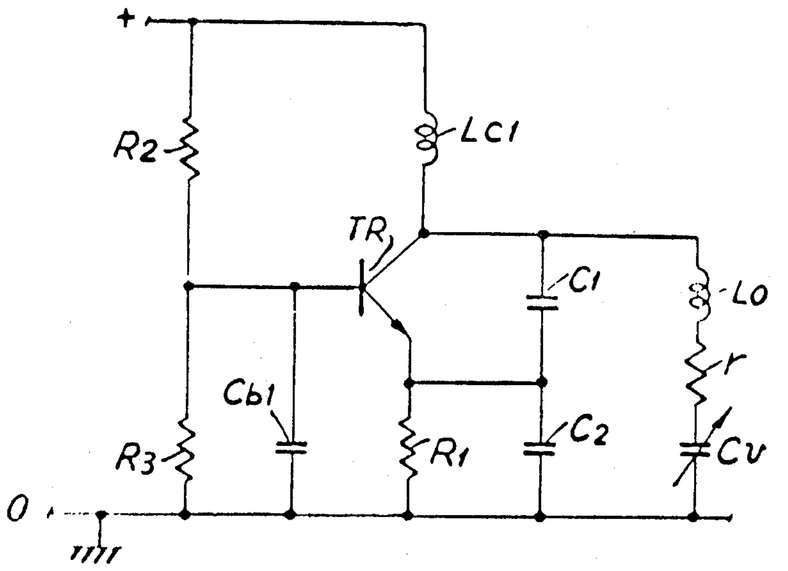
FIG. 1 (PRIOR ART)
Figure 2:
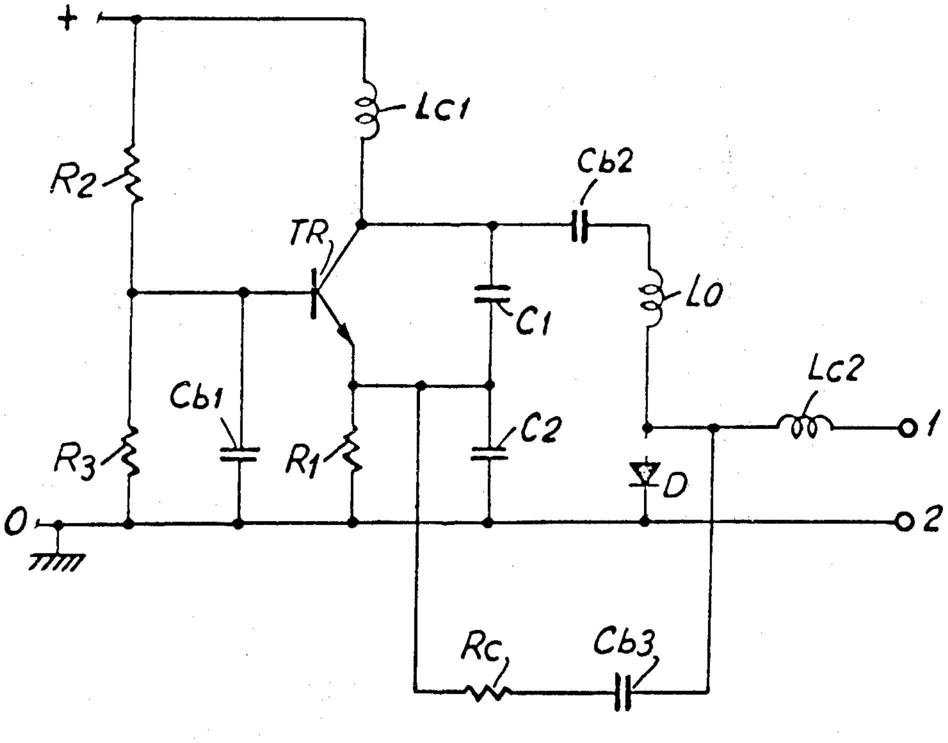

The above mentioned and other features and objects of this invention and the manner of attaining them will become more apparent and the invention itself will best be understood by reference to the following description of an embodiment of the invention taken in conjunction with the accompanying drawings wherein:

FIG. 1 is a schematic diagram of an oscillator conventionally known as the Clapp-type oscillator; and FIG. 2 is a schematic illustration of an embodiment of the present invention.

FIG. 1 shows the construction of an oscillator known as the Clapp-type, in which the oscillation frequency is not easily affected by a variation in the transistor characteristics and which consequently, has excellent oscillation frequency stability. Resistors $R_2$ and $R_3$ constitute a network for supplying a d.c. bias voltage to the base terminal of a transistor TR; while $L_{c1}$ is a choke and $C_{b1}$ a by-pass capacitor for the a.c. voltage. A 70 Mc/s range oscillator circuit of the Clapp-type may be realized using an npn transistor (e.g. 2SC253) and approximate values for $C_1$, $C_2$, $C_v$, $L_o$, and $R_1$ of respectively 40pF, 70pF, 10pF, 0.5$\mu$H, and 300$\Omega$. The resistance component corresponding to the loss of the coil $L_o$ and the capacitor $C_v$, is of the general order of less than a few tens of ohms. Since the oscillation frequency of the Clapp-type oscillator is mainly determined by $L_o$ and $C_v$, and is hardly affected by the collector capacitance, it is frequently used as a stable oscillation circuit.

A frequency modulator of the type employing a variable-capacitance diode has been reported in an article entitled "A Wideband Frequency Modulator having a Variable-Capacitance Diode" by Yoshito Ueno and Sukehiro Ito (Proceedings of 1961 General Meetings of The Institute of Electrical Communication Engineers of Japan, No. 389), and in "A Diode Modulator" by Kazuo Noda (Proceedings of 1963 General Meetings of Four Institutes of Electrical Engineers of Japan, No. 1660). In the latter reference, it is pointed out that good modulation characteristics, in which the relation between the oscillation frequency and the modulating voltage is linear, are obtainable by means of a variable-capacitance diode whose barrier capacitance $C_v$ changes according to the relation, $$C_v \propto V^{-n}, \ (n = 2 \sim 3),$$

where V is a backward bias voltage.

Thus, a stable transistorized frequency modulator may be constructed by varying the bias voltage of a variable-capacitance diode (which may be substituted as the capacitor $C_v$ in FIG. 1) in accordance with the modulating signal. But even in a transistorized frequency modulator of this type, the frequency dependency of the current amplification factor B causes the output power to decrease as the oscillation frequency increases, with the result that the aforementioned AM-PM conversion phenomenon inevitably takes place.

With the present invention, the oscillation frequency versus output power characteristics of a transistorized frequency modulator including a variable-capacitance diode is considerably improved, and consequently, the modulator has a sufficiently high signal to intermodulation noise ratio.

FIG. 2 shows the circuit construction of an embodiment of the present invention wherein 1 and 2 are the input terminals for the modulating signal; $L_{c2}$ is a choke coil which admits the modulating signal but not the oscillation frequency signal; $C_{b2}$ constitutes a short circuit at the modulating signal frequency; $C_{b3}$ is a d.c. blocking capacitor, and D is a variable-capacitance diode. An optimum negative direct-current bias voltage is continuously supplied to the terminals of the variable capacitance diode through the terminals 1 and 2. The capacitance of the diode is thus maintained at the center value $C_o$ at which the oscillation frequency becomes the desired center frequency value $f_o$. When an alternating current voltage of small amplitude is superposed on this backward bias voltage and the resultant voltage is supplied across the variable-capacitance diode D through terminals 1 and 2, the capacitance of the variable-capacitance diode D becomes greater than $C_o$ and consequently the oscillation frequency becomes lower than $f_o$ when this modulating signal voltage varies in a positive direction. Owing to the above-mentioned frequency dependency of the current amplification factor B, the oscillation voltage becomes a little higher. If a portion of this modulating signal is supplied at this stage through $R_c$ to the emitter of the transistor TR, the collector current decreases, since transistor TR is of the npn type. Inasmuch as the oscillation output power depends strongly on the collector current, the increase of the oscillation voltage is suppressed, by supplying the modulating signal to the emitter in this manner. On the other hand, if the modulating voltage becomes negative, the decrease of the oscillation voltage is compensated for the same reason. In other words, by way of supplying a portion of the modulating signal to the emitter, the oscillation frequency versus output power characteristics can be improved. In case of the abovementioned 70 Mc/s range oscillator of the Clapp-type, the optimum value of the resistor $R_c$ lies in the range between several hundred and several thousand ohms.

A portion of the modulating signal can also be supplied to the base rather than the emitter of the transistor TR in FIG. 2. In this case, the connections of the variable-capacitance diode must be reversed. In addition, the value of the capacitor $C_{b1}$ must be chosen to have a short circuit impedance at the oscillation frequency and an open circuit impedance at the frequency of the modulating signal. When a pnp transistor is used instead of the npn transistor, the oscillation frequency versus output power characteristics can also be improved, by supplying a portion of the modulating signal to the emitter or base of the transistor in a similar manner.

What is claimed is:

1. In a transistorized frequency modulator of the type including a Clapp-type oscillator having a transistor and a frequency defining circuit connected across the emitter and collector of the transistor and composed of an inductive element and a plurality of capacitive elements, the improvement for improving the oscillation frequency versus output power characteristics of the modulator comprising a variable capacitance diode substituted for one of said capacitive elements; means for supplying a modulating signal across said variable capacitance diode; and, means connected to said signal supplying means and said variable capacitance-diode for supplying a portion of said modulating signal to one control terminal of said transistor, thereby to increase the collector current when the capacitance of said variable capacitance diode decreases in response to a variation in the voltage of said modulating signal.

* * * * *

UNITED STATES PATENT OFFICE
CERTIFICATE OF CORRECTION

Patent No. 3,899,755 Dated August 12, 1975

Inventor(s) Teiji Uchida

It is certified that error appears in the above-identified patent and that said Letters Patent are hereby corrected as shown below:

In the caption, insert:

-- Assignee: Nippon Electric Company, Limited
Tokyo, Japan --

Signed and Sealed this

*sixteenth* Day of *March 1976*

[SEAL]

*Attest:*

RUTH C. MASON
*Attesting Officer*

C. MARSHALL DANN
*Commissioner of Patents and Trademarks*